United States Patent
Brofman et al.

[11] Patent Number: 5,964,396
[45] Date of Patent: Oct. 12, 1999

[54] ENHANCED CERAMIC BALL GRID ARRAY USING IN-SITU SOLDER STRETCH WITH CLIP

[75] Inventors: Peter J. Brofman, Hopewell Junction; Patrick A. Coico, Fishkill; Mark G. Courtney, Poughkeepsie; Shaji Farooq, Hopewell Junction; Lewis S. Goldmann, Bedford; Raymond A. Jackson; David C. Linnell, both of Poughkeepsie; Gregory B. Martin, Wappingers Falls; Frank L. Pompeo, Montgomery; Kathleen A. Stalter, Hopewell Junction; Hilton T. Toy, Wappingers Falls, all of N.Y.

[73] Assignee: International Business Machines Corporation, Armonk, N.Y.

[21] Appl. No.: 08/909,801
[22] Filed: Aug. 12, 1997
[51] Int. Cl.⁶ .............................. B23K 31/02; B23K 37/04
[52] U.S. Cl. ...................... 228/180.22; 228/6.2; 228/19; 228/49.5
[58] Field of Search .............................. 228/180.22, 6.2, 228/19, 49.5, 44.7

[56] References Cited

U.S. PATENT DOCUMENTS 5,148,968  9/1992  Schmidt et al. .
5,482,200  1/1996  Myers et al. .
5,573,172  11/1996  Gore .

OTHER PUBLICATIONS

L. F. Miller, "Elongated Flexible Chip Joint," *IBM Tech. Discl. Bull.*, vol. 10, No. 11 (Apr. 1968) p. 1670.

"Chip with Lengthened Solder Joints Using Shape Memory Alloy," *IBM Tech. Discl. Bull.*, vol. 29, No. 12 (May 1987) pp. 5213–5214.

*Primary Examiner*—Patrick Ryan
*Assistant Examiner*—Jeffrey T. Knapp
*Attorney, Agent, or Firm*—DeLio & Peterson, LLC; John J. Tomaszewski; Aziz M. Ahsan

[57] ABSTRACT

A device is provided for stretching solder interconnection joints between two substrates of an electronic module. The device employs an expandable metal to exert a separating (stretching) force to the two substrates whereby a lifting rod attached to a clamping bridge is cause to move upwards by expansion of the expandable metal raising a first substrate clamped thereto. A lifting bridge in connection with the clamping bridge is caused to move downward to maintain the lifting bridge in contact with the second substrate being interconnected to the first substrate.

15 Claims, 5 Drawing Sheets

ENHANCED CERAMIC BALL GRID ARRAY USING IN-SITU SOLDER STRETCH WITH CLIP

BACKGROUND OF THE INVENTION

1. Field of the Invention

This invention relates generally to electrically and mechanically interconnecting one electronic component to another electronic component to form an electronic assembly or module and, in particular, to stretching or otherwise elongating the solder joints of an existing module or a module being fabricated to form elongated solder joints having enhanced mechanical and electrical integrity and reliability.

2. Description of Related Art

Forming an electronic package assembly whereby an electrical component such an integrated circuit chip is electrically connected to a substrate such as a card, or board, another chip or another electronic part is well-known in the art. Surface mount technology (SMT) has gained acceptance as the preferred means of joining electronic package assemblies. The following description for convenience will be directed to joining ceramic electronic components such as multilayer ceramic components as exemplified by integrated circuit chips to printed circuit cards or boards.

Multilayer ceramic electronic components are typically joined together by soldering pads on a surface of one of the electronic components to corresponding pads on the surface of the other component. Control Collapse Chip Connection is an interconnect technology developed by IBM as an alternative to wire bonding. This technology is generally known as C4 technology or flip chip packaging. Broadly stated, one or more integrated circuit chips are mounted above a single or multiple layer ceramic substrate or board and pads on the chip are electrically or mechanically connected to corresponding pads on the other substrate by a plurality of electrical connections such as solder bumps. The integrated circuit chips may be assembled in an array such a 10×10 array.

In the C4 interconnect technology, a relatively small solder bump is attached to pads on one of the components being joined. The electrical and mechanical interconnects are then formed by positioning the corresponding pads on the other electronic component adjacent the solder bumps and reflowing the bumps at an elevated temperature. The C4 joining process is self-aligning in that the wetting action of the solder will align the chip bump pattern to the corresponding substrate pads.

A myriad of solder structures have been proposed for the surface mounting of one electronic structure to another. Typical surface mount processes form the solder structures by screening solder paste on conductive, generally metallic pads exposed on the surface of the first electronic structure or substrate. A stencil printing operation is used to align the contact mask to the pads. The solder paste is reflowed in a hydrogen atmosphere and homogenizes the pad and brings the solder into a spherical shape. The solder spheres on the substrate are then aligned to corresponding pads on the electronic structure or board to be connected thereto. After alignment, the substrate and board go through a reflow operation to melt the solder and create a solder bond between the corresponding pads on the substrate and other electronic component. The interconnection is typically in a form of a double truncated sphere as shown in FIG. 6.

Other known surface mount technology uses solder balls rather than solder paste to provide the solder connecting structures. By using solder balls, a more exact and somewhat greater quantity of solder can be applied than from screening. The solder balls are aligned and are held to a substrate and melted to form a solder joint on a conductive pad of the substrate. As before, the substrate with the newly joined solder balls is aligned to the board to be connected therewith and the solder balls are then reflowed to form a solder bond between the two substrates. The use of a copper ball surrounded by eutectic solder is also used as a solder joint structure for attaching a multilayer ceramic (MLC) substrate to a PC laminate wherein the ball serves as a standoff.

C4 joint technology, commonly referred to as ceramic ball grid array technology (CBGA), offers advantages of low cost, and a low inductance surface mounting interconnection. However, a thermal expansion mismatch between the chip and substrate will cause a shear displacement to be applied on each solder connection. Over the lifetime of a module, this leads to an accumulated plastic deformation and decreases the lifetime of the module. The typical solder joint having the shape of a doubly truncated sphere which is truncated at each pad is known to have a limited lifetime due to the thermal mismatch between the substrates and the shape of the bump. It is known that changes in shape away from a spherical segment can produce enhanced mechanical properties and testing has shown an order of magnitude difference in fatigue life between an hour-glass shape and a barrel-shape (double truncated spherical) joint. The fracture location of the hour-glass joint shifted to the center of the joint instead of at the pad-joint interface.

Stretched solder joints have been fabricated by a number of techniques including using different solders on the same chip. Solder columns have also been stacked to achieve improved fatigue life. Two solder alloys have been used in combination wherein the surface tension of a larger bump is used to raise and stretch the smaller area of the joints. Another approach involves stacking C4 bumps using polyimide interposer, but this technique adds considerable cost and manufacturing complexity without improved benefit.

A centrifugal force technique has also been employed wherein modules having C4 solder joints are heated and spun such that the C4s are elongated. This technique has obvious manufacturing difficulties when using large printed circuit cards. Brackets attached to one of the substrates has also been used to stretch the C4 joints as shown in U.S. Pat. No. 5,148,968. Basically, the bracket, when activated by heat or other means, raises one of the substrates in the z-axis stretching the C4 connection. Some of the brackets, however, becomes an integral part of the final structure requiring the packaging design to incorporate the bracket and related fixturing.

Bearing in mind the problems and deficiencies of the prior art, it is therefore an object of the present invention to provide a method of forming an elongated solder joint between two solder interconnected substrates in an electronic module to enhance the mechanical and electrical integrity and reliability of the module.

It is another object of the present invention to provide a chip or bracket stretching device for stretching solder joints to form an elongated solder joint between two solder interconnected substrates of an electronic module to enhance the mechanical and electrical integrity and reliability of the module.

A further object of the invention is to provide electronic modules having solder joints having enhanced mechanical and electrical integrity and reliability.

It is yet another object of the present invention to provide an electronic component assembly or module made using the method and stretching device of the invention.

3

Other objects and advantages of the invention will be readily apparent from the description.

SUMMARY OF THE INVENTION

The above and other objects, which will be apparent to those skilled in art, are achieved in the present invention which is directed in a first aspect to a method of forming an elongated solder joint between two solder interconnected substrates in an electronic module comprising the steps of attaching a stretching device employing an expandable metal to exert a separating (stretching) force to a first substrate containing a plurality of solder bumps, positioning the attached substrate adjacent a second substrate to be interconnected thereto, reflowing the solder to form an interconnected solder joint and then increasing the temperature of the interconnected substrate to activate (expand) the expandable metal of the device whereby the first substrate and second substrate are stretched or separated to form elongated solder joints and then cooling the substrates forming the stretched module.

In a further aspect of the invention, a stretching device is provided for forming an elongated solder joint between two solder interconnected substrates in an existing electronic module or a module being formulated comprising:

a clamping bridge comprising a U-shaped structure having upwardly extending opposed/vertical members and a connecting base and opposed clamping means extending below the lower surface of the clamping bridge for clamping the clamping bridge to a first substrate to be interconnected, the first substrate having solder bumps thereon;

a lifting bridge comprising an inverted U-shaped structure having opposed downwardly extending vertical members and a connecting base which base overlies the base of the clamping bridge with the arms of the lifting bridge overlying the base of the clamping bridge and clamped substrate;

a lifting rod fixedly connected to the connecting base of the clamping bridge at one end and extending through an opening in the lifting bridge; and an expandable metal disposed above the connecting base of the lifting bridge and in communication with the connecting base of the lifting bridge whereby when the device and attached first substrate is positioned on top of a second substrate to be interconnected to the first substrate and the expandable metal is expanded the expanded metal exerts an upward force lifting the lifting rod and a downward force on the connecting base of the lifting bridge raising the clamping bridge and lifting the clamped substrate relative to the second substrate and lengthening the solder interconnection.

In a preferred embodiment, the vertical members of the clamping bridge have attached thereto rotatable cantilevered cams which when the clamping bridge is raised during stretching of the solder joints the cams rotate and contact the upper surface of the connecting base of the lifting bridge maintaining the lifted position of the raised clamping bridge and providing uniformity in the desired stretched joints between the first and second substrates.

In an additional aspect of the invention, an electronic component assembly or module is made using the method and/or device of the invention as described hereinabove. The electronic component module of the invention will typically have hour-glass shaped solder joints between the two substrates which joints are formed by the stretching action of the stretching device used to separate the solder interconnected substrates during the method of the invention.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT

Figure 1:
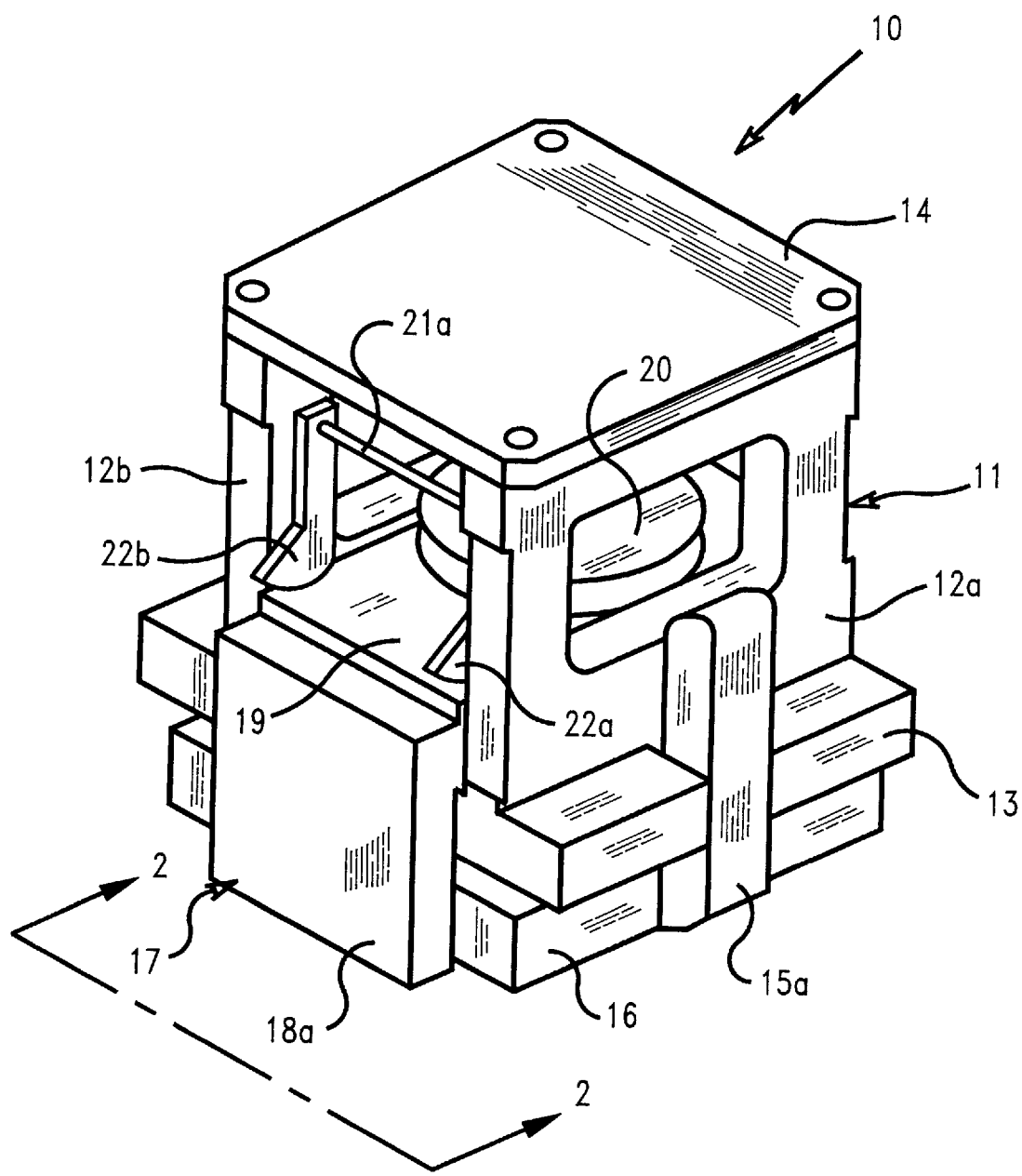
FIG. 1 is a perspective view of a stretching device of the invention.

In describing the preferred embodiment of the present invention, reference will be made herein to FIGS. 1–7 of the drawings in which like numerals refer to like features of the invention. Features of the invention are not necessarily shown to scale in the drawings.

Figure 6:
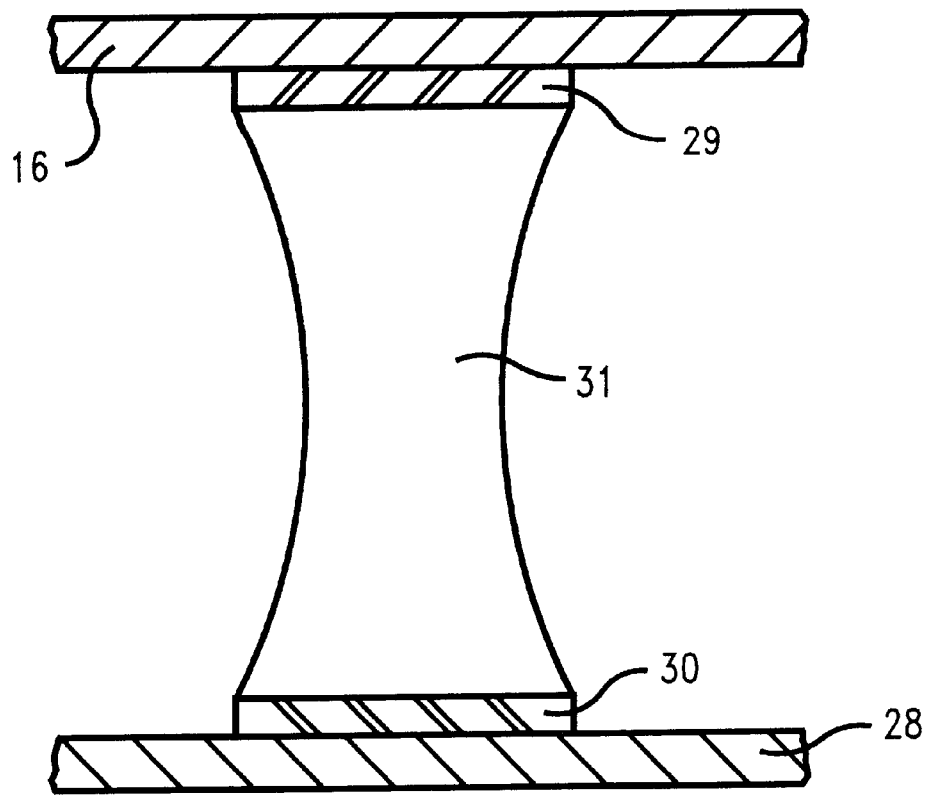
FIG. 6 is a cross-sectional view of a lengthened solder joint of the invention.
Figure 7:
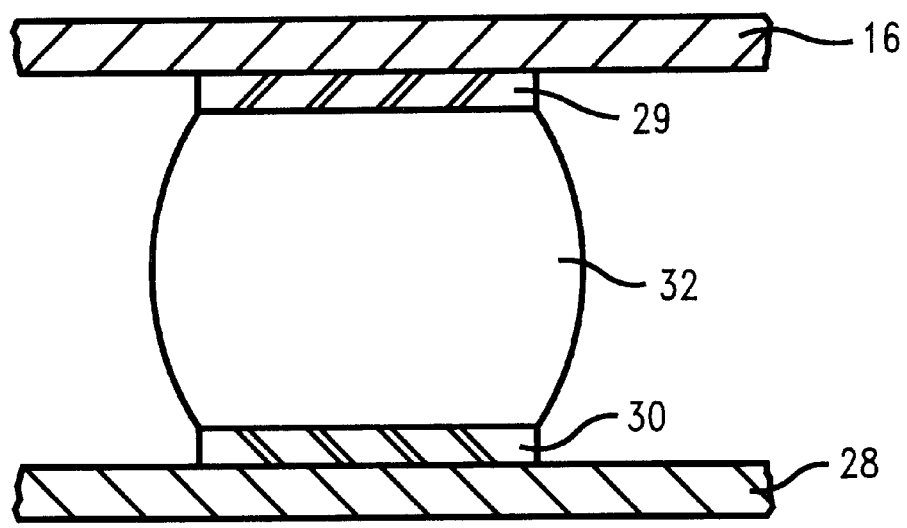
FIG. 7 is a cross-sectional view of a double truncated spherical solder joint of the prior art.

Referring first to FIGS. 6 and 7, FIG. 7 shows a typical double truncated spherical solder joint 32 between two electronic substrates. In FIG. 7, a substrate 16 which will typically be a chip is shown having a pad 29. The double truncated spherical solder joint 32 is shown connecting pad 29 to pad 30 of substrate 28 which is typically a printed circuit board. With the prior art solder joint 32 shown in FIG. 7, stresses at the intersection of the solder joint with the pads is where failure typically occurs reducing reliability and integrity of the module.

FIG. 6 shows a cross-sectional view of the preferred stretched solder joint made by the method and using the device of the invention. Accordingly, chip 16 having pad 29 is shown interconnected by solder joint 31 to pad 30 of substrate 28. The solder joint 31 has a hour-glass figure which is more elongated and has a higher fatigue resistance than the double truncated spherical solder joint 32 shown in FIG. 7.

The solder used to join the substrates may be any suitable solder used in the prior art. Typically, the solder is a lead-tin solder and is preferably a lead-tin eutectic alloy solder such as 37 percent Pb and 63 percent Sn (by weight). The solder preferably has a single composition (is not a mixture of solders) and has a single melting point range. It is an important feature of the invention that the solder used to interconnect the substrates has a melting point less than the activation temperature of the expandable metal used to provide the stretching forces of the device. Typically, the expandable metal of the invention will remain in a fixed position until a particular temperature is reached at which point the expandable metal will expand providing stretching forces between the substrates. The expandable metal may be any suitable metal such as a bimetallic material the layers of which have different thermal expansion coefficients. The metals may be memory alloys which revert to a different shape when a particular temperature is reached. The expandable metal will typically be layers of the metal secured at the ends (periphery) thereof so that when the metal expands a bowing effect is provided to the metal which provides a stretching effect to the device as described below.

Although various sizes and geometries of the solder joint can be achieved with the method and device of the invention the hour-glass solder joint configuration of FIG. 6 is preferred. In an exemplary embodiment, the double truncated spherical solder joint 32 of FIG. 7 having about a 35 mil sphere diameter measured along an axis parallel to the pad surfaces is stretched, as shown in FIG. 6, to a solder joint height of about 50 mils with a width at the mid-span of the joint being about 20 mils. The stretched solder joint of FIG. 6 has a much higher fatigue resistance and greater reliability and integrity then the double truncated spherical joint of FIG. 7.

Referring to FIG. 1, a stretching device of the invention is shown generally at 10. The device comprises a clamping bridge shown generally as 11 which is of a U-shape and which comprises vertical upwardly extending members 12a and 12b connected by a base connecting member 13. A top cross member 14 is shown connecting vertical members 12a and 12b forming a square. A clamping member 15a is rotatably attached to base converting member 13 of clamping bridge 11 and is used to clamp a substrate 16 to the device 10. An opposed clamping member 15b (not shown) is used in conjunction with clamping member 15a to clamp substrate 16 on opposed sides thereof. Clamping member 15b does not have to be rotatable. Clamping member 15a is preferably spring actuated to provide a secure clamp to substrate 16.

A lifting bridge shown generally as 17 is of an inverted U-shaped and comprises downwardly extending vertical members 18a and 18b (not shown) connected by a base connecting member 19. The base connecting member 19 of the lifting bridge 17 overlies the base connecting member 13 of the clamping bridge 11. An expandable metal ring or collection of expandable discs 20 is shown disposed on the connecting member 19 of lifting bridge 17. The function of the expandable metal ring 20 will be described hereinbelow.

Attached to the vertical members 12a and 12b of clamping bridge 11 are rods 21a and 21b (not shown). Rotatable cantilever cams 22a and 22b are used to maintain the height of the stretched solder joints during the stretching operation by maintaining the raised height of clamping bridge 11 vis-a-vis lifting bridge 17.

Figure 2:
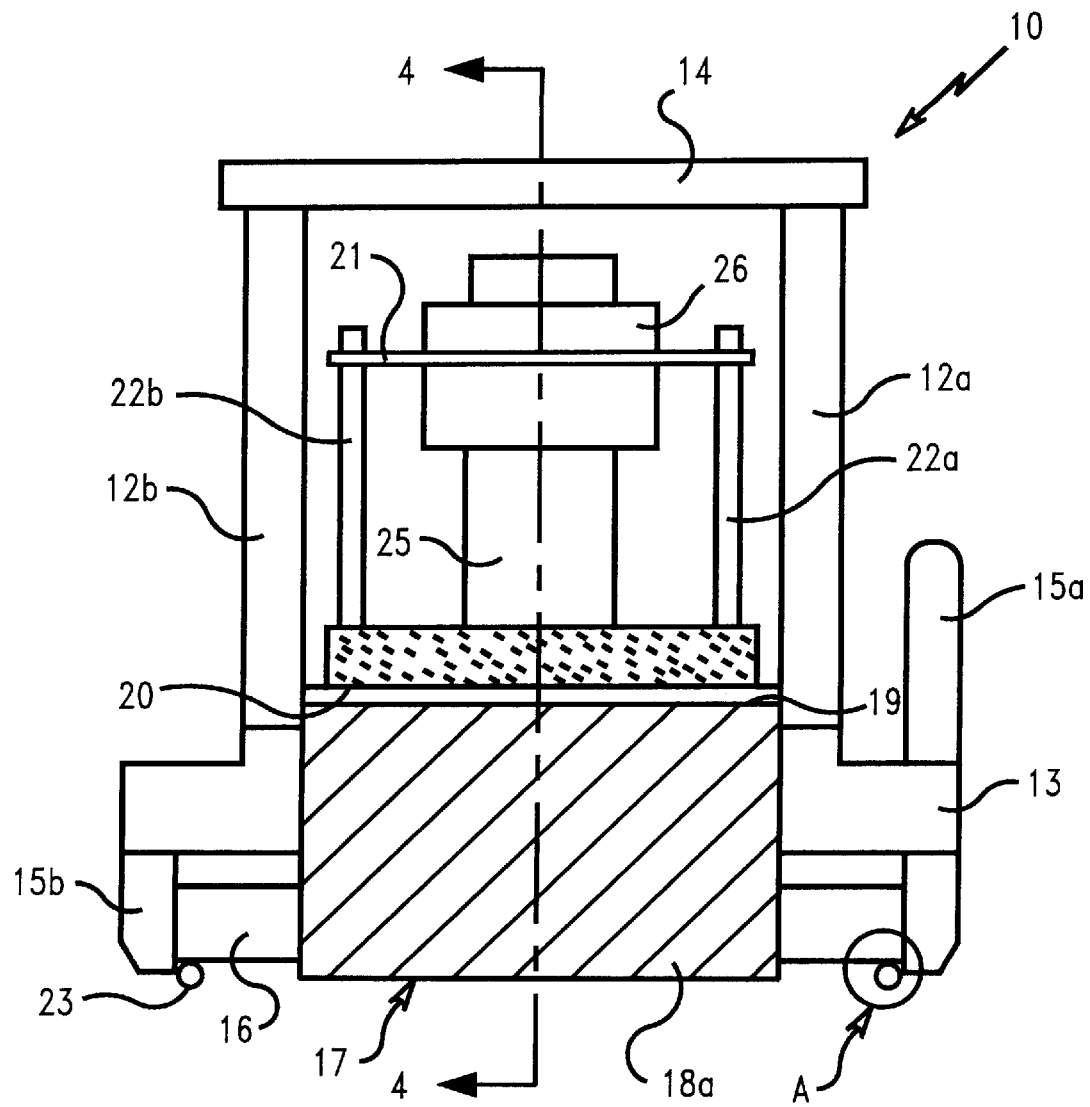
FIG. 2 is a side view of FIG. 1 taken along line 2—2.

Referring now to FIG. 2 which is a side view of FIG. 1 taken along lines 2—2, use of the device 10 to clamp a substrate 16 is shown. Accordingly, substrate 16 having solder bumps 23 on the lower surface thereof is secured to device 10 by clamping means 15a and 15b. Device 10 also comprises a lifting rod 25 which is fixedly connected to connecting member 13 of clamping bridge 11 at one end and has a nut 26 disposed at the other end. An expandable disc 20 is shown disposed on the upper surface of base connecting member 19 of lifting bridge 17, and, upon expansion, contacts nut 26 to lift rod 25.

Figure 3:
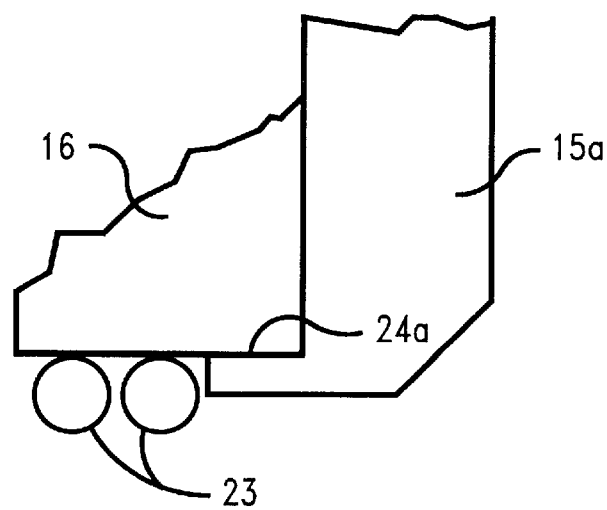
FIG. 3 is an exploded view of section A of FIG. 2.

Referring to FIG. 3, the clamping member 15a is shown having an inward projection 24a which holds substrate 16 to the device 10. The clamping member 15a is preferably spring actuated to hold substrate 16 in a secure fixed position.

Figure 4:
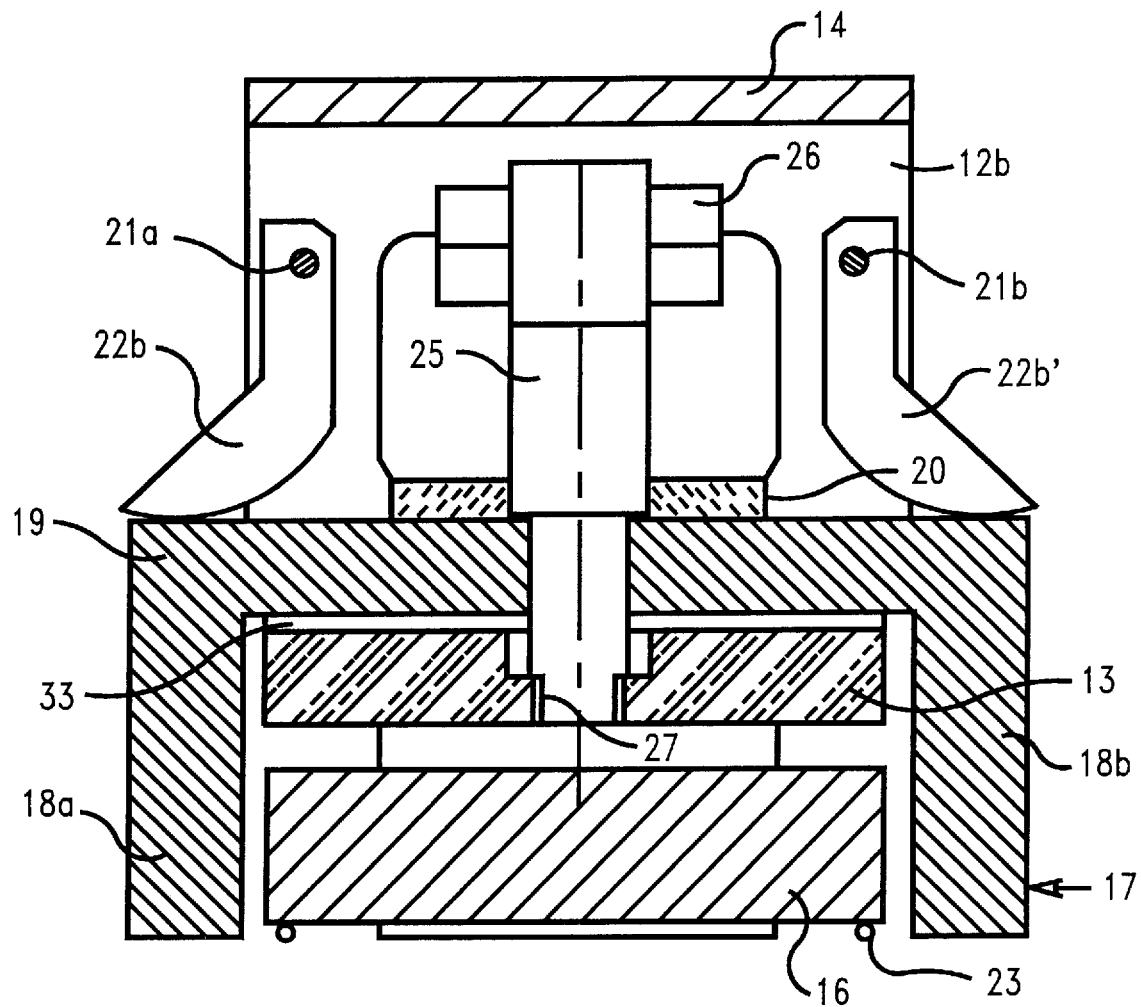
FIG. 4 is a cross-sectional view of FIG. 2 taken along line 4—4.

Referring now to FIG. 4, the relative positions of the substrate 16, base connecting member 13 of the clamping bridge and lifting bridge 17 is shown. Lifting rod 25 is fixedly connected to base connecting member 13 of the clamping bridge 11 and when expandable metal ring 20 is caused to expand, the expanding metal exerts an upward force on nut 26 and a downward force on lifting bridge 17 raising the base connecting member 13 of clamping bridge 11. Base connecting member 13 is secured to substrate 16 by clamping members 15a and 15b and accordingly when base connecting member 13 and clamping bridge 11 is lifted by rod 25, substrate 16 will also be lifted the same distance. The maximum lifting distance is shown as space 33 in FIG. 4. When member 13 travels the distance of space 33 to contact member 19, the lifting stops. Cantilever cams 22b and 22b' are also connected to clamping bridge 11 and will be caused to be swing inwardly as base connecting member 13 and clamping bridge 11 is raised. The cams will lock in the position of base clamping member 13 relative to the lift height. This would assure that the stretched solder joints 23 are maintained at a uniform height since the clamping bridge 11 will be unable to fall due to the locking action of the cams.

Figure 5A:
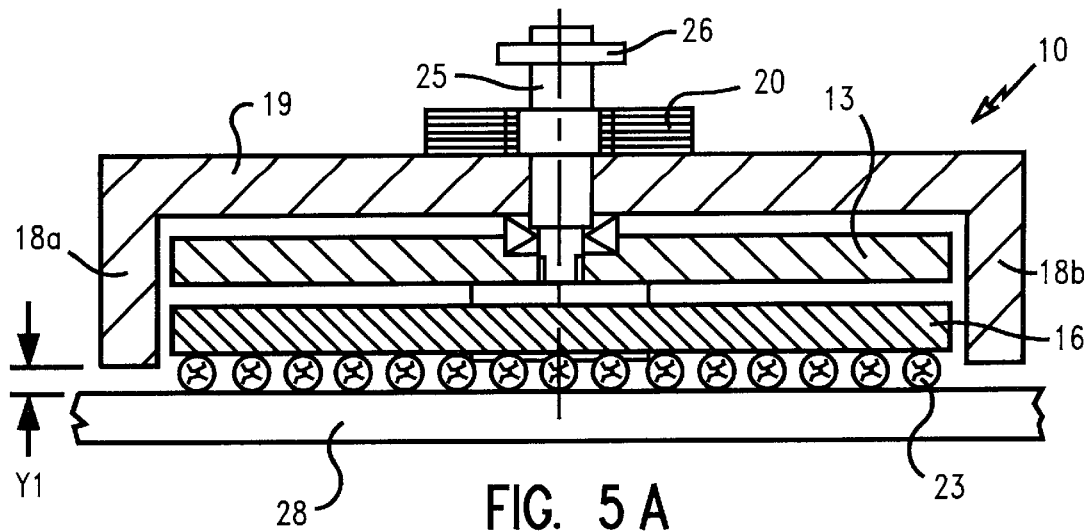
FIGS. 5A–5C show a schematic view of the device of the invention used to clamp and lengthen the solder joints of an interconnected substrate.
Figure 5B:
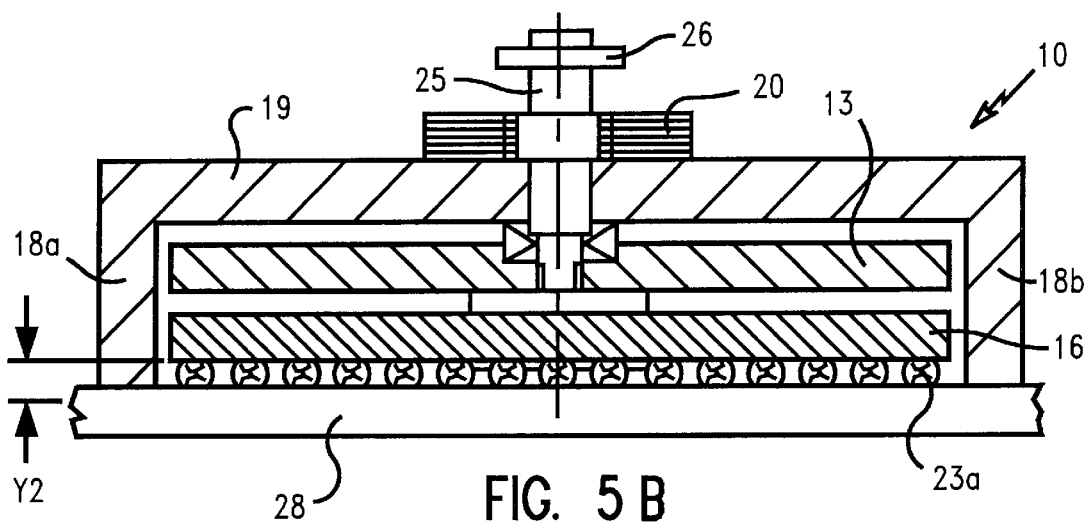
Figure 5C:
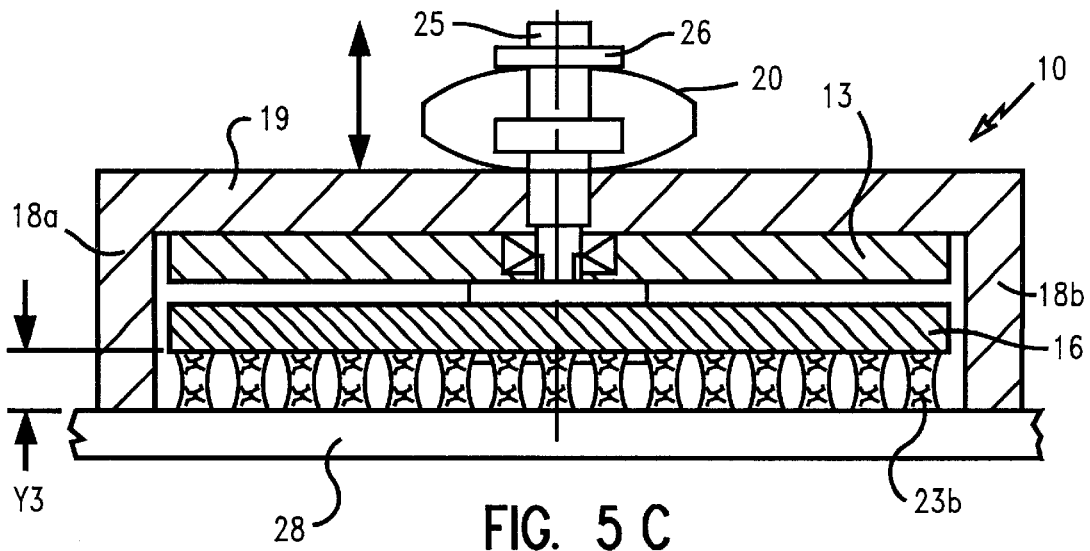

Referring to FIGS. 5A–5C, operation of the device during a stretching process is demonstrated. In FIG. 5A, device 10 is shown secured to substrate 16. Substrate 28 to be interconnected thereto is shown aligned with solder balls 23 of substrate 16. The ends of downwardly extending members 18a and 18b of lifting bridge 17 are shown disposed slightly above the upper surface of substrate 28 a distance Y1. In FIG. 5B, when the solder balls 23 are reflowed, the weight of the device compresses the solder balls forming compressed solder balls 23a. This forms a suitable bonding pressure to bond the solder to substrates 16 and 28. The temperature of the device is then raised to plasticize the solder joint, preferably by raising the temperature thereof above the liquidus temperature to melt the solder of the joints, and cause the metal ring 20 to expand. In FIG. 5C, expanded expandable metal ring 20 is shown exerting upward and downward force on nut 26 and base connecting member 19 thereby raising base connecting member 13 of clamping bridge 11 and lengthening solder joints 23a forming elongated solder joints 23b. The device is then cooled to solidify the elongated solder joints.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. Apparatus for forming an elongated solder joint between two solder interconnected substrates in an electronic module comprising:

a stretching device employing an expandable metal disc adapted to separate a first substrate and second substrate and to exert a separating force to an electronic module having the first substrate containing a plurality of solder bumps forming a solder joint interconnected to the second substrate;

means for heating the device to activate the expandable metal and separate the first substrate and second substrate and elongate the solder joint; and means for cooling the first and second substrates to form the elongated solder joint.

2. The apparatus of claim 1 wherein the liquidus temperature of the solder is less than the activation temperature of the expandable metal.

3. A method of forming an elongated solder joint between two solder interconnected substrates in an electronic module comprising the steps of:

a) attaching an apparatus as in claim 1 containing an expandable metal disc to an electronic module having a first substrate containing a plurality of solder bumps forming a solder joint interconnected to a second substrate;

b) heating the device to activate the expandable metal disc of the apparatus and separate the first substrate and second substrate and elongate the solder joint; and c) cooling the substrates to form the elongated solder joint.

4. The method of claim 3 wherein in step (c) the device is heated to above the liquidus temperature of the solder to elongate the solder joint.

5. Apparatus for forming an elongated solder joint between two solder interconnected substrates in an electronic module comprising:

a stretching device employing an expandable metal disc adapted to exert a separating force to a first substrate containing a plurality of solder bumps;

means for positioning the first substrate adjacent a second substrate to be interconnected thereto;

means for reflowing the solder to form an interconnected solder joint between the first substrate and the second substrate;

means for separating the first substrate and second substrate to elongate the solder joint by expanding the expandable metal disc of the device; and means for cooling the substrates to form the elongated solder joint.

6. The apparatus of claim 5 wherein the liquidus temperature of the solder is less than the activation temperature of the expandable metal.

7. A method of forming an elongated solder joint between two solder interconnected substrates in an electronic module comprising the steps of:

a) attaching an apparatus as in claim 5 containing an expandable metal disc to a first substrate containing a plurality of solder bumps which apparatus is adapted to exert a separating force to the first substrate;

b) positioning the attached substrate adjacent a second substrate to be interconnected thereto;

c) reflowing the solder to form an interconnected solder joint between the first substrate and the second substrate and then separating the first substrate and second substrate by expanding the metal disc of the apparatus to elongate the solder joint; and d) cooling the substrates to form the elongated solder joint.

8. The method of claim 7 wherein in step (c) the temperature is increased after reflowing to above the liquidus temperature of the solder to elongate the solder joint.

9. A stretching device for forming an elongated solder joint between two solder interconnected substrates comprising:

a clamping bridge having a clamping bridge connecting base and opposed clamping means extending below the lower surface of the clamping bridge base for clamping the clamping bridge to a first substrate to be interconnected, the first substrate having solder bumps thereon;

a lifting bridge having a lifting bridge connecting base overlying the clamping bridge base with the arms of the lifting bridge overlying the base of the clamping bridge and clamped substrate;

a lifting rod fixedly connected to the clamping bridge connecting base and extending through an opening in the lifting bridge; and an expandable metal disposed above and in communication with the lifting bridge connecting base whereby when the device and attached first substrate is positioned on top of a second substrate to be interconnected to the first substrate, the expandable metal is adapted to exert an upward force lifting the lifting rod and a downward force on the lifting bridge connecting base raising the clamping bridge and lifting the clamped substrate relative to the second substrate to lengthen the solder interconnection.

10. The device of claim 9 wherein the liquidus temperature of the solder is less than the activation temperature of the expandable metal.

11. A method of forming an elongated solder joint between two solder interconnected substrates in an electronic module comprising the steps of:

a) attaching a stretching device as in claim 9 which device is adapted to exert a separating force to a first substrate containing a plurality of solder bumps;

b) positioning the attached substrate adjacent a second substrate to be interconnected thereto;

c) reflowing the solder to form an interconnected solder joint between the first substrate and the second substrate and then separating the first substrate and second substrate by expanding the metal disc of the device to elongate the solder joint; and d) cooling the substrates to form the elongated solder joint.

12. A method of forming an elongated solder joint between two solder interconnected substrates in an electronic module comprising the steps of:

a) attaching a stretching device as in claim 9 which device employs an expandable metal disc adapted to exert a separating force to an electronic module having a first substrate containing a plurality of solder bumps forming a solder joint interconnected to a second substrate;

b) heating the device to activate the expandable metal disc and separate the first substrate and second substrate and elongate the solder joint; and c) cooling the substrates to form the elongated solder joint.

13. The device of claim 9 wherein the clamping bridge comprises a U-shaped structure having upwardly extending opposed vertical members.

14. The device of claim 13 wherein the lifting bridge comprises an inverted U-shaped structure having opposed downwardly extending vertical members.

15. The device of claim 14 wherein the vertical members of the clamping bridge have attached thereto rotatable cantilevered cams which, when the clamping bridge is raised during stretching of the solder joints, the cams are adapted to rotate and contact the upper surface of the lifting bridge connecting base to maintain the lifted position of the raised clamping bridge.

* * * * *